United States Patent
Amerasekera et al.

(10) Patent No.: US 6,469,353 B1
(45) Date of Patent: Oct. 22, 2002

(54) INTEGRATED ESD PROTECTION CIRCUIT USING A SUBSTRATE TRIGGERED LATERAL NPN

(75) Inventors: E. Ajith Amerasekera, Plano, TX (US); Charvaka Duvvury, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 987 days.

(21) Appl. No.: 08/673,939

(22) Filed: Jul. 1, 1996

(51) Int. Cl.[7] .............................................. H01L 23/62
(52) U.S. Cl. ...................................................... 257/356
(58) Field of Search ........................................ 257/356

(56) References Cited

U.S. PATENT DOCUMENTS

| 5,225,702 A | 7/1993 | Chatterjee et al. ........... 257/360 |
| 5,290,724 A | 3/1994 | Leach | |

FOREIGN PATENT DOCUMENTS

EP  0 546 698 A1  11/1992  ........... H01L/27/02

OTHER PUBLICATIONS

Steven H. Voldman and Gianfranco Gerosa; "Mixed-Voltage Interface ESD Protection Circuits For Advanced Microprocessors In Shallow Trench and LOCOS Isolation CMOS Technologies"; 1994 IEEE, IEDM 94–277.

*Primary Examiner*—Stephen D. Meier
(74) *Attorney, Agent, or Firm*—Jacqueline J. Garner; W. James Brady, III; Frederick J. Telecky, Jr.

(57) ABSTRACT

An ESD protection circuit (100) and method is described herein. A lateral npn transistor (104) is connected between an I/O pad (110) and ground (GND). A substrate biasing circuit (150) increases the voltage across a substrate resistance (114) during an ESD event by conducting current through the substrate. This, in turn, triggers the lateral npn (104) which clamps to voltage at the pad (110) and dissipated the ESD current. The lateral npn (104) is the primary protection device for dissipating ESD current.

19 Claims, 3 Drawing Sheets

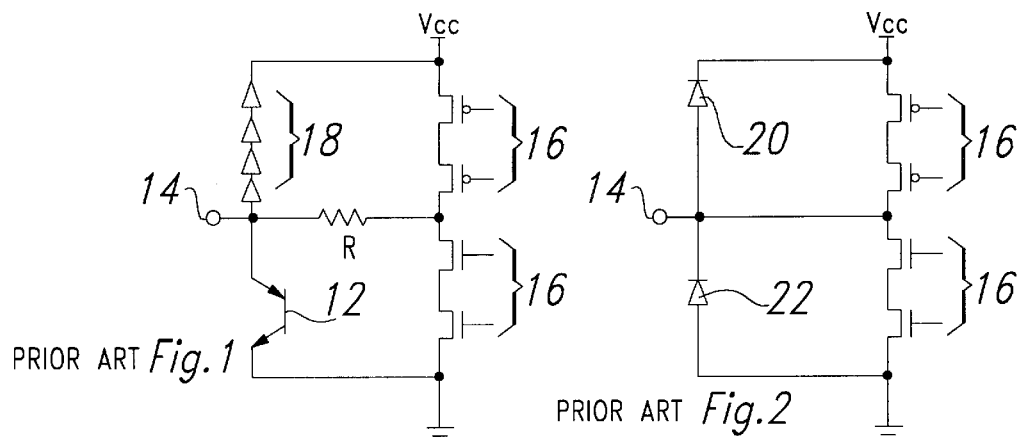
PRIOR ART Fig.1
PRIOR ART Fig.2
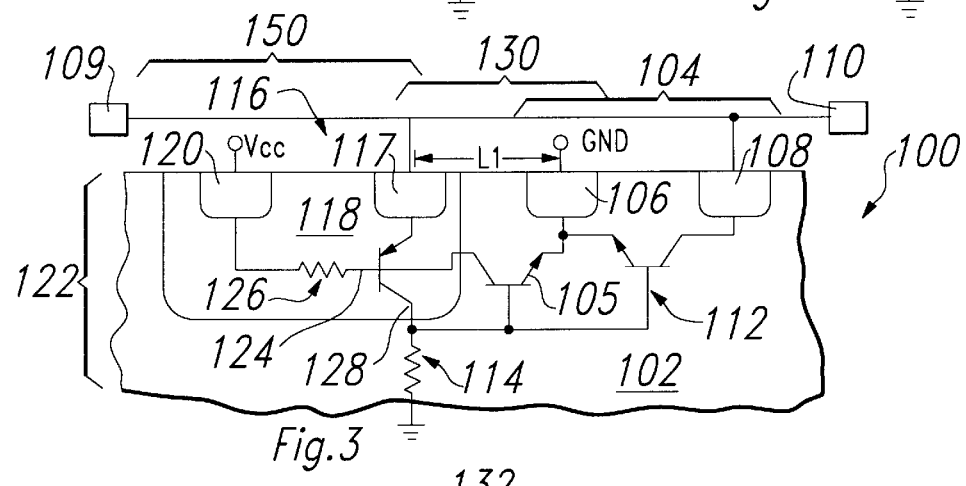
Fig.3
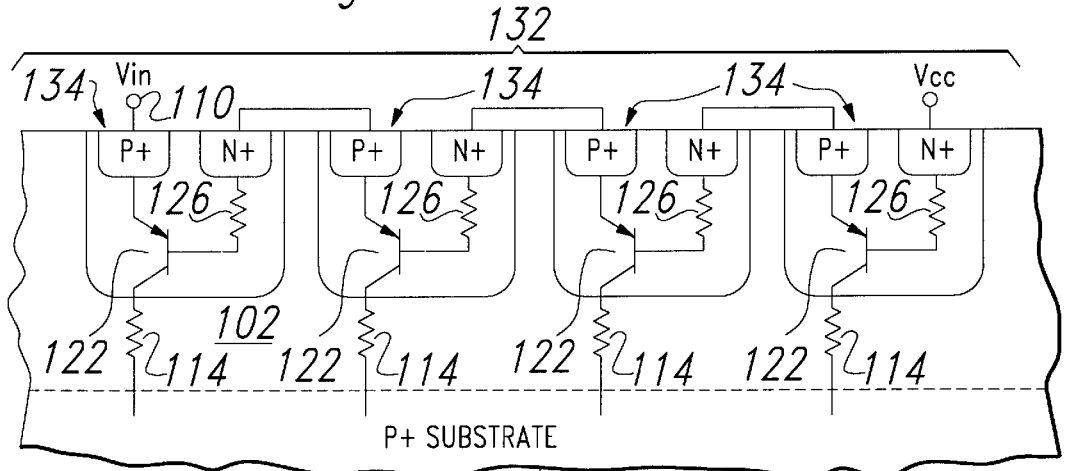
Fig.4
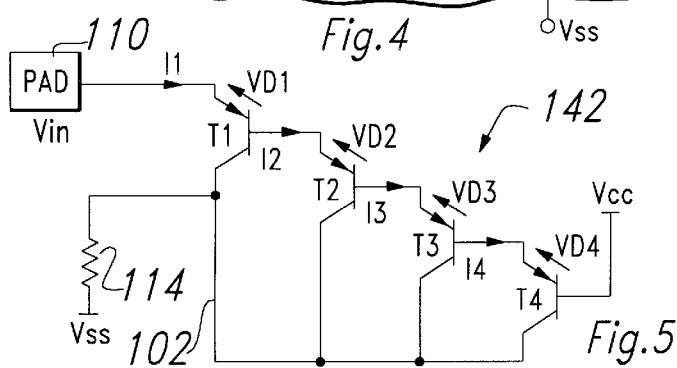
Fig.5

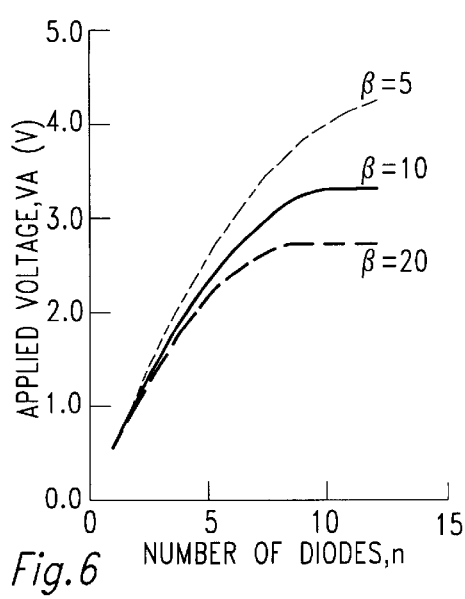
Fig.6
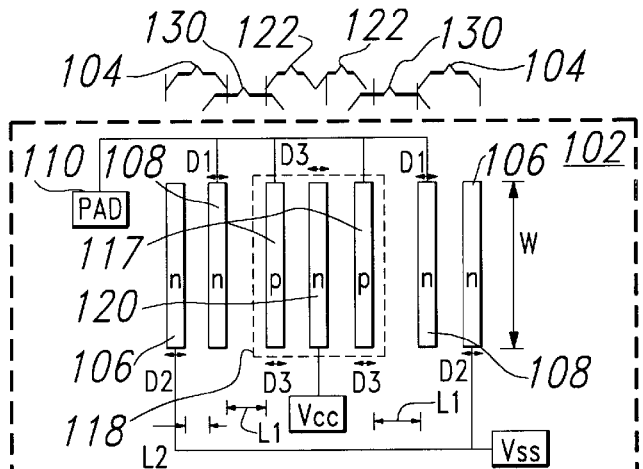
Fig.11
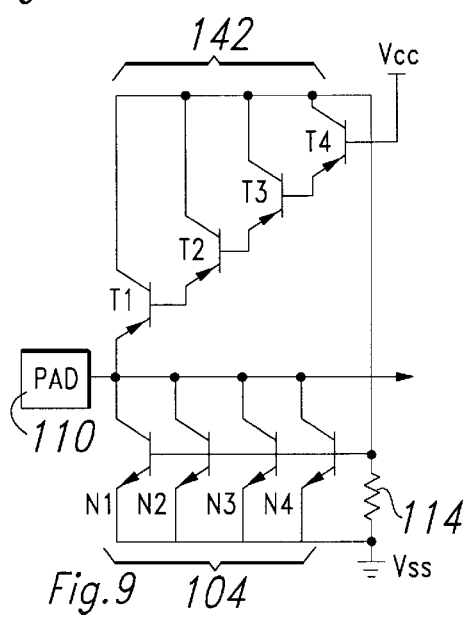
Fig.9
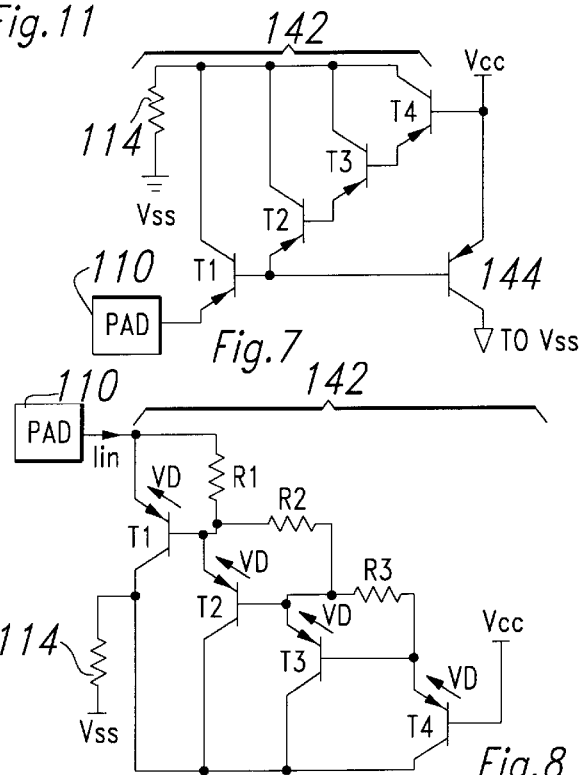
Fig.7
Fig.8
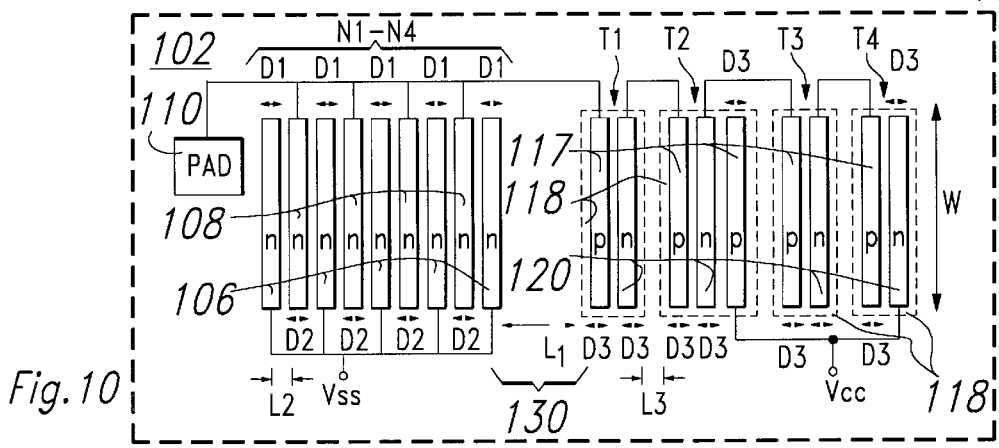
Fig.10

INTEGRATED ESD PROTECTION CIRCUIT USING A SUBSTRATE TRIGGERED LATERAL NPN

FIELD OF THE INVENTION

This invention generally relates to semiconductor devices and processes and more specifically to ESD protection in CMOS integrated circuits.

BACKGROUND OF THE INVENTION

As integrated circuits (ICs) become more complex and more dense, the nominal supply voltage drops. Whereas, once nominal supply voltages were in the 5V range and then the 3.3V range, state of the art ICs today have a nominal supply voltage of approximately 2.5 V. However, these ICs must operate in systems designed for older ICs having a 3.3V nominal supply voltage. Thus, today's ICs are expected to be able to sustain 3.3 V at the input/output (I/O) pins without excessive leakage or any permanent damage occurring. However, since a gate oxide on the order of 60 Å is used in the newer ICs, there is a possibility of reliability problems related to gate oxide wear-out based on time dependent dielectric breakdown analysis. In addition, the ICs are expected to be power-up sequence independent. That is, when the supply voltage is at 0 V, the IC needs to be able to tolerate 3.6 volts at the I/O pins without permanent damage or excessive oxide stressing.

These requirements place major restrictions on the electrostatic discharge (ESD) protection circuit design. Gate oxides cannot be connected directly between the at the I/O pads and ground. Thus, typical ESD protection circuits such as the gate-coupled nMOS transistor, low voltage triggered SCRs (silicon-controlled rectifiers) and gate-coupled SCRs cannot be used as they have been in the past. One prior art technique that avoids connecting a gate oxide directly between the internal circuitry at the I/O pins and ground in a modified lateral SCR (MLSCR), shown in FIG. 1. The MLSCR 12 is connected between the I/O pin 14 and ground GND. Unfortunately, the trigger voltage of the MLSCR (about 20V) is higher than the breakdown of a gated-diode junction (typically between 8V and 10V) or a gate oxide (typically about 12V–15V). Hence, a series resistor R is required to enable the voltage at the anode of the MLSCR 12 to reach the SCR trigger level before the internal circuitry 16 is damaged.

Another ESD protection circuit that avoids connecting a gate-oxide directly between the internal circuitry at the I/O pins and ground is a dual-diode circuit, shown in FIG. 2. A first diode 20 is connected between the I/O pin 14 and the supply voltage, Vcc and a second diode 22 is connected between I/O pin 14 and ground, GND. However, this circuit has limitations in submicron devices. The voltage-clamping properties of a reversed biased n+/p diode is one limitation. The on-resistance of a reversed-biased diode in avalanche breakdown is greater than 25 ohms. This limits the capability of high current clamping. Accordingly, there is a need for an improved ESD protection circuit that avoids connecting a gate oxide between internal circuitry and ground.

SUMMARY OF THE INVENTION

An ESD protection circuit and method for integrated circuits is described herein. A lateral npn transistor is connected between an I/O pad and ground. A substrate biasing circuit is provided that causes current to be conducted through the substrate resistance during an ESD event. This, in turn, raises the voltage across the substrate resistance and forward-biases the emitter-base junction of the lateral npn thus triggering the lateral npn. The lateral npn is the primary protection device for dissipating ESD current.

An advantage of the invention is providing improved ESD protection for multi-voltage applications in submicron, thin oxide CMOS processes.

A further advantage of the invention is providing improved ESD protection for multi-voltage applications that is independent of the power-up sequence in submicron, thin oxide CMOS processes.

A further advantage of the invention is providing improved ESD protection requiring less area in submicron, thin oxide CMOS processes.

These and other advantages will be apparent to those skilled in the art having reference to the specification in conjunction with the drawings.

BRIEF DESCRIPTION OF THE DRAWINGS

In the drawings:

FIG. 1 is a schematic diagram of a prior art ESD protection circuit;

FIG. 2 is a schematic diagram of a prior art dual-diode ESD protection circuit;

FIG. 3 is a partially cross-section/partly schematic diagram of an ESD protection device according to one embodiment of the invention;

FIG. 4 is a partially cross-section/partly schematic diagram of an ESD protection device according to the invention having a diode string;

FIG. 5 is a schematic diagram of an ESD protection device according to the invention including a Darlington circuit;

FIG. 6 is a graph of applied voltage versus number of diodes for various vertical pnp transistor gains;

FIG. 7 is a schematic diagram of an ESD protection device according to the invention including a snubber circuit for reducing reverse leakage current;

FIG. 8 is a schematic diagram of an ESD protection device according to the invention including emitter base resistors in a Darlington circuit for increasing the maximum clamp voltage and reducing the reverse leakage current;

FIG. 9 is a schematic diagram of an ESD protection device according to the invention illustrating a Darlington circuit and multiple lateral npn transistors;

FIG. 10 is a exemplary layout diagram of an ESD protection device according to the invention;

FIG. 11 is a preferred layout of an ESD protection device according to the invention;

Corresponding numerals and symbols in the different figures refer to corresponding parts unless otherwise indicated.

DETAILED DESCRIPTION OF PREFERRED EMBODIMENTS

Figure 12:
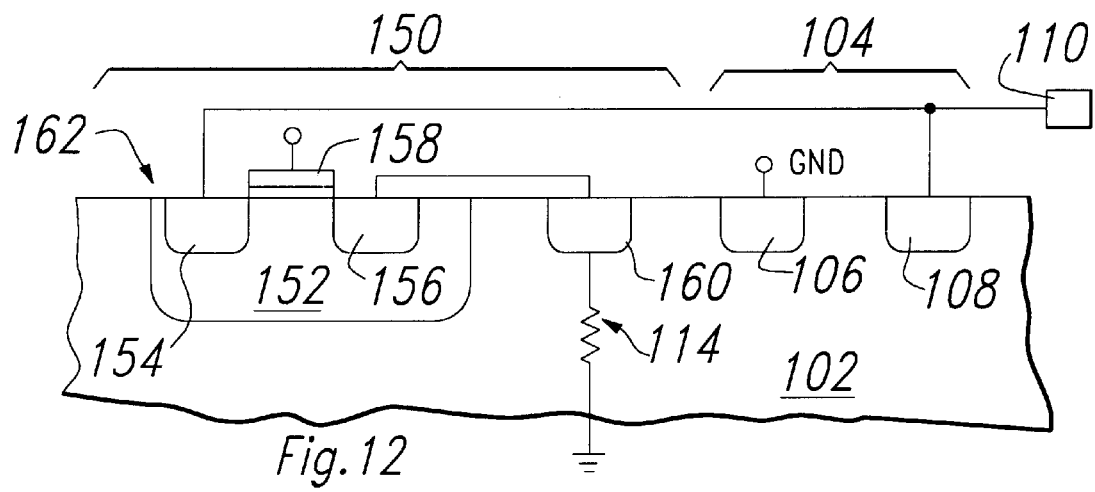
FIG. 12 is a schematic diagram of a first alternative embodiment of the invention.

An ESD protection device 100 according to the invention is shown in FIG. 3. A lateral npn transistor 104 is located in a substrate layer 102. Substrate layer 102 may, for example, comprise a p-type epitaxial layer on a p+ substrate. Lateral npn 104 comprises two n-type diffused regions 106,108 as the emitter and collector respectively. Diffused regions 106 and 108 are preferably separated by the minimum spacing allowed by design rules, for example on the order of 0.7 microns. Diffused region 106 (the emitter) is connected to ground and diffused region 108 (the collector) is connected to the I/O pad 110. The base 112 is connected to ground through the substrate 102 and its associated resistance 114.

Substrate biasing circuit 150 can be any one of a number of circuits that raises the voltage across the substrate resistance 114 during an ESD event. This, accordingly, raises the voltage at the base of lateral npn 104 to forward bias the emitter-base junction and trigger the npn transistor 104. The npn transistor 104 clamps the voltage at the pad 110 to a voltage on the order of 5–7 volts and dissipates the ESD current. Thus, the internal circuitry 109 is protected.

Substrate biasing circuit 150, in the embodiment shown in FIG. 3, comprises a diode 116. Diode 116 comprises a p-type diffused region 117 within n-well 118. P-type diffused region 117 is connected to the I/O pad 110. The supply voltage Vcc is connected to n-well 118 through n-type diffused region 120. Diode 116 thus comprises an inherent vertical pnp transistor 122. Vertical pnp transistor 122 is not a discrete element but is automatically built-in to diode 116 within n-well 118. P-type diffused region 117 forms the emitter of the inherent vertical pnp transistor 122 and the base 124 is connected to the supply voltage Vcc through the n-well 118 resistance 126 and n-type diffused region 120. The collector 128 is connected through the substrate resistance 114 to ground, GND. An advantage of the invention is that it is applicable to CMOS processes without additional masking steps. Alternative substrate biasing circuits will be apparent to those skilled in the art having reference to the specification.

Operation of the above described circuit under ESD conditions will now be described. At a first stage of operation, the voltage at I/O pad 110 reaches the turn-on voltage of vertical pnp 122. This may be on the order of 0.8 V. ESD current then begins to conduct through vertical pnp 122. This raises the voltage across the substrate resistance 114 and accordingly at the base of lateral npn 104. In the second stage of operation, the voltage at the base of lateral npn 104 eventually rises enough to forward bias the emitter-base junction, triggering the npn transistor 104. The clamping voltage of the lateral npn 104 is the same as the snapback voltage of a lateral field oxide MOS device (i.e., on the order of 5–7 V). At this point, the majority of the current dissipates through lateral npn transistor 104. In the last stage of operation, an inherent SCR 130 created by n-type diffused region 106, the substrate 102, the n-well 118 and p-type diffused region 117 triggers providing a second voltage clamp. The spacing L1 between the anode (p-type diffused region 117) and cathode (n-type diffused region 106) of the SCR 130 determines the holding voltage of the SCR 130. This is preferably greater than the burn-in voltage and for accelerated reliability testing of about 4V in an advanced CMOS process. The burn-in voltage may for example be on the order of 4.5V. The SCR 130 is also triggered by the vertical pnp action. The collector current through the p-substrate 102 enables the cathode (n-type diffused region 106) to substrate 102 junction to forward bias triggering an inherent lateral npn 105 and then the inherent SCR 130. The SCR 130 is preferably designed so that once the SCR 130 triggers, the voltage clamps to greater than 4V.

Because the ESD protection device 100 according to the invention does not comprise a thin gate oxide, there are no gate oxide integrity problems associated with multi-voltage operation. Multi-voltage operation occurs when the voltage at the I/O pad 110 can be higher than the designed for supply voltage Vcc. For example, the device is fabricated for 2.5V operation but in operation receives I/O signals ranging from 0 to 3.3 V. Receiving a higher voltage at the I/O pad 110 than the supply voltage Vcc (i.e., 3.3V for a 2.5 V device) does not stress the protection device 100. Furthermore, the ESD protection device 100 is independent of power-up sequence. That is, the device 100 is not stressed when a high signal (i.e., 3.3V) is applied at the I/O pad 110 while the supply voltage Vcc remains at 0V.

In the preferred embodiment of the invention, diode 116 actually comprises a diode string 132 as shown in FIG. 4 in order to increase the clamping voltage at the pad for input voltages greater than Vcc. Diode string 132 is connected between the I/O pad 110 and the supply voltage, Vcc. The pn diodes 134 are lateral elements in that the dominant current flow is lateral. However, as shown in FIG. 5 and described above, the lateral pn diode actually forms the emitter-base junction of a vertical pnp transistor 122 with the p-type substrate 102 serving as the collector. This creates a multi-stage pnp Darlington circuit 142 as shown in FIG. 5. FIG. 5 illustrates a four-stage pnp Darlington circuit 142 having four inherent vertical pnp transistors T1–T4. The emitter of the Darlington circuit 142 is connected to the I/O pad 110, the collector is the substrate 102, and the base is connected to the supply voltage Vcc.

The equation governing the total voltage, $V_{IN}$ across the Darlington circuit is easily determined by considering the gain, $\beta$, and the forward voltage drop, $V_D$, across the base-emitter junction of each pnp transistor as indicated in FIG. 5.

The current, $I_1$, in the first transistor, T1, is given by, $$I_1 = I_0 \exp\left(\frac{qV_{D1}}{kT}\right)$$

$I_0$ is the saturation current across the p+/n junction and $V_{D1}$ is the voltage drop across the base-emitter junction. Similarly the current, $I_2$, in the second transistor, $T_2$, is given by, $$I_2 = I_0 \exp\left(\frac{qV_{D2}}{kT}\right)$$

For $\Delta V = (V_{D1} - VD_{D2})$, $$\frac{I_1}{I_2} = \exp\left(\frac{q\Delta V}{kT}\right)$$

or, $$\Delta V = \frac{kT}{q} \ln\left(\frac{I_1}{I_2}\right)$$

$$\Delta v = \frac{kT}{q} \ln(1+\beta),$$

since $I_1 = (1+\beta)I_2$. Hence, it can be shown that for a string of n transistors, $$V_{IN} = nV_{DI} - \frac{n(n-1)}{2} \frac{kT}{q} \ln(1+\beta).$$

This equation is valid for $n \leq V_A/[kT\ln(I_1/I_0)]$, that is for $V_{D1}=V_A/N$. It must be noted that it is assumed that $\beta$ is independent of current in this equation for simplified analysis.

The equation indicates that because of the $\beta$ of the vertical pnp, the voltage drop will not be equal across each diode, and beyond a certain n there will no longer be any diode current. The maximum number of diodes that can successfully be used in series is determined by the $\beta$ of the pnp. Assuming $V_{D1}$=0.6 V, a plot of the maximum $V_A$ as a function of the number of diodes is shown in FIG. 6 for $\beta$ of 5, 10 and 20. For a $\beta$ of 10, the maximum voltage clamp for a straight diode string is $\approx$3.3 V, and for a $\beta$ of 5, a 4 V clamp is achieved with an 11 diode string. The maximum $V_A$ occurs for strings of >12 diodes.

It should be noted that in a high gain process, the emitter areas of the different stages need not be the same. Since the current decreases in the stages closer to $V_{cc}$ these transistors can have proportionately smaller areas.

If desired, a snubber circuit may be used to reduce the reverse leakage current between Vcc and the pad in normal operation. For example, a snubber transistor 144 may be placed between the base of the first stage of the Darlington circuit 142 and the base of the final stage as shown in FIG. 7. The purpose of the snubber transistor 144 is to clamp the voltage at the base of the first stage to that of one forward biased diode below the supply voltage Vcc. This snubs the other pnp stages until the voltage at the I/O pad 110 exceeds the supply voltage, Vcc.

Optional feed-forward resistors R1–R3 may be placed between the different diodes of the Darlington circuit 142 as shown in FIG. 8 to increase the clamping voltage onto the pad and reduce the reverse leakage current. Resistors R1–R3 increase the clamping voltage by ensuing that transistors closer to Vcc are turned on. In addition, without resistors R1–R3, the first stages of the Darlington circuit 142 carry most of the current and the later stages may not turn on. Resistors R1–R3 allow current to flow in parallel with each of the Darlington stages and control the voltage drop across each stage. For an equal voltage drop across each stage, the resistors are proportioned as R, R/2, R/3, . . . , R/(n−1) for n stages. For example, for a 1 mA current limit at the I/O pad 110 and a 6 diode string with a resistor across every two diodes, R is 2 k$\Omega$.

As shown in FIG. 9, lateral npn 104 can also comprise a plurality of lateral npn transistors N1–N4. The base of each lateral npn N1–N4 is connected to the substrate resistance 114. Each emitter is connected to ground (Vss) and each collector is connected to I/O pad 110.

An exemplary layout for the invention is shown in FIG. 10. The layout of FIG. 10 assumes a four stage Darlington circuit. However, those skilled in the art will realize that the number of stages may vary. The lateral npn transistors N1–N4 are formed using n-type diffused regions 106,108 within substrate 102. The n-type diffused regions 106 and 108 alternate between connecting to ground Vss (n-type diffused regions 106) and the I/O pad 110 (n-type diffused regions 108). The spacing L2 between diffused regions 106 and 108 is preferably the minimum allowed by the design rules (i.e., on the order of 0.7 microns). Each diffusion width, D1 and D2 is on the order of 3 microns.

The diodes 134/pnp transistors T1–T4 are each formed in a separate well regions 118 using one p-type diffused region 117 and one n-type diffused region 120 in each well region 118. The p-region 117 of the first pnp transistor stage T1 is connected to the I/O pad 110. The n-region 120 is connected to the p-region 117 of the second stage T2. The n-region 120 of the second stage T2 is then connected to the p-region 117 of the third stage T3 and so on until the last stage T4. The n-region 120 of the last stage T4 is connected to the supply voltage Vcc. The n-well to n-well spacing may be the minimum allowed to conserve area, for example 3 microns. The p- and n- diffused region widths D3 may be on the order of 5 microns and the spacing L1 between the p-type diffused region 117 of the first stage and the nearest n-type diffused region 106 may be on the order of 3.5 microns. It is this spacing that determines the holding voltage of the SCR 130. The width W may be on the order of 70 microns. An advantage of the invention is that it requires only a small area (i.e., approximately 5000 microns using sub-0.5$\mu$ design rules). For example, the layout of FIG. 10 results in an area on the order of 5600 microns.

A preferred layout for a vertical pnp triggered ESD protection circuit according to the invention is shown in FIG. 11. The lateral npn transistors 104 are formed using n-type diffused regions 106,108 within substrate 102. The n-type diffused regions 106 and 108 alternate between connecting to ground Vss (n-type diffused regions 106) and the I/O pad 110 (n-type diffused regions 108). The spacing L2 between diffused regions 106 and 108 is preferably the minimum allowed by the design rules (i.e., on the order of 0.7 microns). Each diffusion width, D1 and D2 is on the order of 3 microns. Two diodes/vertical pnp transistors 122 are formed in well regions 118 using two p-type diffused regions 117 and one n-type diffused region 120. The p-regions 117 are connected to the I/O pad 110. The n-region 120 is connected to Vcc. The p- and n- diffused region widths D3 may be on the order of 5 microns and the spacing L1 between the p-type diffused region 117 and the nearest n-type diffused region 106 may be on the order of 3.5 microns. It is this spacing that determines the holding voltage of the SCR 130. The width W may be on the order of 70 microns.

FIG. 12 illustrates a first alternative substrate biasing circuit for triggering lateral npn 104 according to the invention. In the embodiment of FIG. 12, substrate biasing circuit 150 comprises a lateral PMOS transistor 162 consisting of p-type source/drain regions 154 and 156 in n-well 152 and gate 158. Source/drain region 154 is connected to pad 110 and source/drain region 156 is connected to a p-type diffused region 160 located directly within substrate 102. The gate 158 is connected such that the PMOS transistor 162 conducts current during the ESD event. As current is conducted through the PMOS transistor 162 and to p-type diffused region 160, the voltage across substrate resistance 114 is increased. Operation then continues in the manner described above. Lateral npn transistor 104 triggers due to the increase voltage across the substrate resistance 114, clamps the voltage at the pad 110 and dissipates the ESD current.

Figure 13:
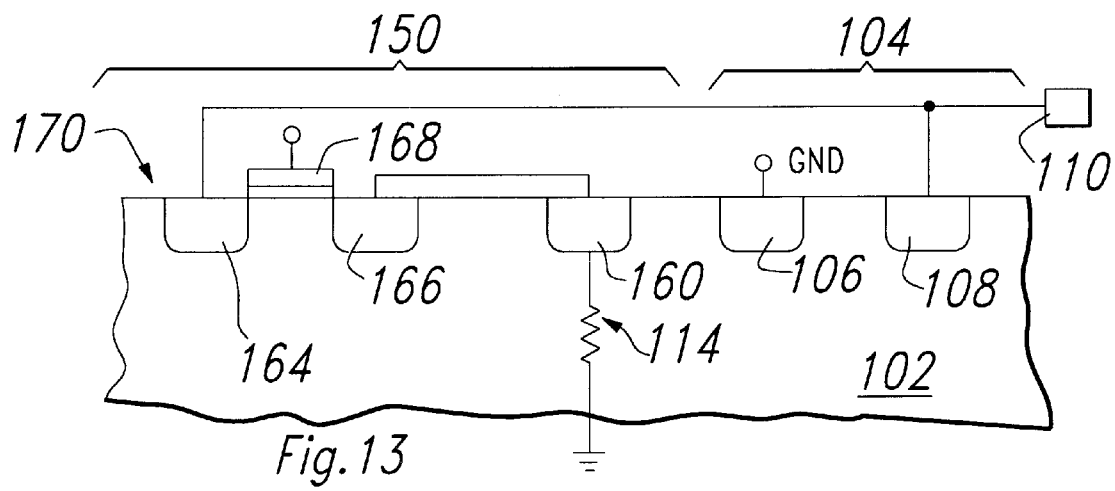
FIG. 13 is a schematic diagram of a second alternative embodiment of the invention.

FIG. 13 illustrates a second alternative substrate biasing circuit for triggering lateral npn 104 according to the invention. In the embodiment of FIG. 12, substrate biasing circuit 150 comprises a lateral NMOS transistor 170 consisting of n-type source/drain regions 164 and 166 and gate 168. Source/drain region 164 is connected to pad 110 and source/drain region 166 is connected to a p-type diffused region 160 located directly within substrate 102. The gate 168 is connected such that the NMOS transistor 170 conducts current during the ESD event. As current is conducted through the NMOS transistor 170 and to p-type diffused region 160, the voltage across substrate resistance 114 is increased. Operation then continues in the manner described above. Lateral npn transistor 104 triggers due to the increased voltage across the substrate resistance 114, clamps the voltage at the pad 110 and dissipates the ESD current.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An ESD protection circuit formed in a substrate comprising:
    a lateral npn transistor for which said substrate serves as a base; and
    a substrate biasing circuit for triggering said lateral npn transistor by increasing a voltage across the substrate resistance during an ESD event, said substrate biasing circuit having a turn-on voltage less than a breakdown voltage of said lateral npn transistor, wherein said substrate biasing circuit comprises a diode including an inherent vertical pnp transistor wherein a collector of said inherent vertical pnp transistor is connected to a base of said lateral npn transistor for triggering said lateral npn through the substrate resistance.

2. The ESD protection circuit of claim 1, wherein said diode comprises:
    a p-type diffused region located within a well region and connected to an input/output pad; and
    a n-type diffused region located within said well region and connected to a supply voltage.

3. The ESD protection circuit of claim 2, further comprising an inherent silicon-controlled rectifier (SCR) formed of said p-type diffused region, said well region, said substrate, and an emitter region of said lateral npn transistor.

4. The ESD protection circuit of claim 1 wherein said diode comprises a Darlington string of diodes connected between an I/O pad and a supply voltage.

5. The ESD protection circuit of claim 4, wherein said lateral npn comprises a plurality of npn transistors each having a collector connected to said I/O pad, an emitter connected to a ground potential, and a base connected to said ground potential through an inherent resistance in said substrate.

6. The ESD protection circuit of claim 4, further comprising a reverse diode connected in parallel with said Darlington string of diodes for leakage reduction.

7. The ESD protection circuit of claim 4, further comprising at least one resistor connected between an emitter and base of at least one diode in said Darlington string of diodes.

8. The ESD protection circuit of claim 4, wherein said Darlington string of diodes comprises between 2 and 12 diodes.

9. An ESD protection device located in a substrate, comprising:
    a plurality of lateral npn transistors each having a diffused emitter region connected to a low supply voltage and a diffused collector region connected to an input/output pad, wherein said substrate forms a base for each of said plurality of lateral npn transistors; and
    a plurality of pn diodes connected in a Darlington circuit between said input/output pad and a high supply voltage, wherein each of said plurality of pn diodes comprises an inherent vertical pnp transistor with the substrate forming a collector of each vertical pnp transistor for triggering said plurality of lateral npn transistors by increasing a voltage across a substrate resistance, said vertical pnp transistors having a turn-on voltage less than a breakdown voltage of said plurality of lateral npn transistors.

10. The ESD protection circuit of claim 9, wherein each of said plurality of pn diodes comprises:
    a n-type well region located in said substrate, said n-type well region forming a base region of said inherent vertical pnp transistor;
    a n-type diffused region within said n-type well region for providing a connection to said base region of said inherent vertical pnp transistor; and
    a p-type diffused region within said n-type well region, said p-type diffused region forming an emitter region of said inherent vertical pnp transistor.

11. The ESD protection circuit of claim 10, further comprising at least one inherent silicon-controlled rectifier (SCR) formed of said p-type diffused region and said well region of one of said plurality of pn diodes, said substrate, and a diffused emitter region of one of said plurality of lateral npn transistors.

12. The ESD protection circuit of claim 9, further comprising a reverse diode connected in parallel with said plurality of pn diodes.

13. The ESD protection circuit of claim 9, further comprising at least one resistor connected between said n-type diffused region and said p-type diffused region of at least one diode of said plurality of pn diodes for balancing the current in said pn diodes of said plurality of pn diodes and for increasing the clamp voltage for mixed voltage operation.

14. A method for ESD protection of internal circuitry at an input/output pad comprising the steps of:
    connecting at least one pn diode having an inherent vertical pnp transistor to said input/output pad;
    connecting at least one lateral npn transistor to a low supply voltage and said input/output pad, wherein a substrate forms a base of said at least one lateral npn transistor and a collector of said inherent vertical pnp transistor;
    conducting ESD current through said inherent vertical pnp transistor to increase a voltage level across a substrate resistance in order to increase the voltage at said base of said at least one npn transistor; and
    triggering said at least one lateral npn transistor when said voltage level at said base of said at least one npn transistor reaches a base-emitter forward bias voltage.

15. The method of claim 14 further comprising the step of triggering an inherent silicon-controlled rectifier (SCR) under ESD conditions comprised of at least one pn diode and said at least one lateral npn transistor.

16. The method of claim 13, wherein said SCR clamps a voltage level at said input/output pad on the order of 4.5 V.

17. The method of claim 15, wherein a holding voltage of the SCR is tunable.

18. The method of claim 14, wherein said conducting ESD current step occurs when a voltage level at said input/output pad reaches on the order of 0.8 V.

19. The method of claim 14 wherein said at least one lateral npn transistors clamps a voltage level at said input/output pad to on the order of 5–7 V.

* * * * *